(12) United States Patent
Wolf et al.

(10) Patent No.: US 6,354,845 B1
(45) Date of Patent: Mar. 12, 2002

(54) APPARATUS AND METHOD FOR CONNECTING A PLURALITY OF ELECTRICAL CIRCUITS BORNE UPON A PLURALITY OF SUBSTRATES

(75) Inventors: Karl Erich Wolf, Rockwall; William Lonzo Woods, Jr., Kaufman, both of TX (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/584,988

(22) Filed: Jun. 1, 2000

(51) Int. Cl.$^7$ ............................................... H01R 12/00
(52) U.S. Cl. ........................................... 439/75; 439/81
(58) Field of Search ............................... 439/61, 66, 83, 439/91, 876, 840, 75, 82, 245, 591, 775, 816, 825

(56) References Cited

U.S. PATENT DOCUMENTS

| | | | |
|---|---|---|---|
| 3,616,532 A | * 11/1971 | Beck | 29/615 |
| 4,889,496 A | * 12/1989 | Neidich | 439/75 |
| 4,948,224 A | * 8/1990 | Modrey | 439/840 X |
| 4,961,709 A | * 10/1990 | Noschese | 439/66 |
| 5,167,512 A | * 12/1992 | Walkup | 439/66 |
| 5,184,962 A | * 2/1993 | Noschese | 439/66 |
| 5,928,000 A | * 7/1999 | Rudisill et al. | 439/63 |
| 6,095,823 A | * 8/2000 | Banks | 439/66 |

* cited by examiner

Primary Examiner—Brian Sircus
Assistant Examiner—Son V. Nguyen
(74) Attorney, Agent, or Firm—Donald D. Mondul

(57) ABSTRACT

An apparatus for connecting a plurality of electrical circuits borne upon a plurality of substrates is disclosed. A first substrate of the plurality of substrates has a first aperture having a first diametral displacement and a first inner wall. A portion of the first inner wall is electrically connected with a first circuit borne upon the first substrate. The apparatus comprises a sheet of electrically conductive material arranged to a displacement from an axis in a substantially helical orientation about the axis. The material has a spring characteristic when the helical orientation establishes the displacement at a spring displacement. The spring characteristic urges the conductive material to a greater displacement from the axis than the spring displacement and permits insertion of the apparatus in the first aperture. The spring characteristic and the first diametral dimension cooperate to seat the apparatus in the first aperture to establish electrical connection with the first circuit. The method comprises the steps of: (a) spirally winding a sheet of electrically conductive material to an insertion diametral displacement generally equal to or slightly greater than the first diametral displacement; and (b) urging the spirally wound sheet into the first aperture.

14 Claims, 3 Drawing Sheets

APPARATUS AND METHOD FOR CONNECTING A PLURALITY OF ELECTRICAL CIRCUITS BORNE UPON A PLURALITY OF SUBSTRATES

BACKGROUND OF THE INVENTION

The present invention relates to electrical connection in a printed wiring board venue, and especially to inter-board physical and electrical connection between wiring boards. Conventional inter-board physical and electrical connection between printed wiring boards is commonly effected using pins having a split, or "C-shaped" cross sectional configuration. A significant disadvantage of such pin connectors is that they commonly make physical and electrical contact only at three points within an aperture in a wiring board into which the pin is inserted. Moreover, such split pins commonly require high pressure fitting forces to ensure a tight fit within the mounting aperture. Hardened press pins overcome some disadvantages. For example, hardened press pins are able to better withstand high insertion pressures employed to press fit them into apertures. However, such hardened pins are expensive to manufacture. In this world in which cost advantages for high volume products are measured in fractions of pennies, it is desirable to avoid the expense of using hardened connector pins.

There is a need for an inexpensive interconnect apparatus and method for use in establishing physical and electrical connections between printed wiring boards that is installed with a relatively low force press fit. Most preferably, the interconnect apparatus should have high electrical conductivity and a high current-carrying capacity, on the order of 25 amperes or more. It is also preferable that the interconnect apparatus presents low electrical resistance. Most desirably an apparatus for interconnecting wiring boards will have a construction establishing a hermetically sealed structure resistant to corrosion and establishing a substantially complete electrical joint within a mounting aperture in order to reduce arcing and other sources of electromagnetic noise. It is desirable that such a connection apparatus be capable of operating at normal operating temperatures associated with operation of a power electrical circuit. In a particular embodiment of the invention, overheating of a circuit does not cause circuit failure because the connecting apparatus has a self-healing characteristic. In particular, the apparatus facilitates solder reflow to repair circuit anomalies caused by overheating.

SUMMARY OF THE INVENTION

An apparatus for connecting a plurality of electrical circuits borne upon a plurality of substrates is disclosed. At least a first substrate of the plurality of substrates has a first aperture having a first diametral displacement and a first inner wall. At least a portion of the first inner wall is electrically connected with a first circuit of the plurality of circuits borne upon the first substrate. The apparatus comprises a sheet of electrically conductive material arranged to a displacement from an axis in a substantially helical orientation about the axis. The material has a spring characteristic when the helical orientation establishes the displacement at a spring displacement. The spring characteristic urges the conductive material to a greater displacement from the axis than the spring displacement and permits insertion of the apparatus in the first aperture. The spring characteristic and the first diametral dimension cooperate to seat the apparatus in the first aperture to establish electrical connection with the first circuit.

A method for connecting a plurality of electrical circuits borne upon a plurality of substrates is also disclosed. At least a first substrate of the plurality of substrates has a first aperture having a first diametral displacement and a first inner wall. At least a portion of the first inner wall is electrically conductive and connected with a first circuit of the plurality of circuits borne upon the first substrate. The method comprises the steps of: (a) spirally winding a sheet of electrically conductive material to an insertion diametral displacement generally equal to or slightly greater than the first diametral displacement; and (b) urging the spirally wound sheet into the first aperture.

The method may comprise, following step (a), the further steps of: (1) depositing a plating mask material upon the electrically conductive material; (2) removing the plating mask from outside surfaces of the spirally wound material; and (3) plating the outside surfaces to enhance solderability of the outside surfaces.

In the preferred embodiment of the present invention, a roll pin construction is employed for a terminal to effect mechanical and electrical connection between printed wiring boards of an inter-board electrical circuit. Installation of the connection involves inserting the roll pin into a plated through-hole in one of the wiring boards, such as the wiring board carrying a power module circuit. The pin establishes a mechanical connection between the power module and another board, which may be supplied by a customer. The pin also established an electrical connection between the circuitry carried on the two wiring boards. The pin may or may not need to be soldered. Because of the spiral roll-up construction of the pin, and the spring bias thereby established in the pin, a nearly 360 degree connection between the pin and the interior wall of the plated through-hole is established. Such a nearly 360 degree connection provides low resistance, high current-carrying capacity and a near-hermetic sealed connection that reduces arcing and other electromagnetic noise sources. Soldering the pin-and-board assembly reflows solder between the pin and the wall of the through-hole to enhance the quality and completeness of the connection between the pin and board.

Prior art roll pins available at present are generally constructed of steel. The inventors found that steel roll pins exhibited too great a spring bias against the interior walls of through-holes and tended to fracture or break board material in the vicinity of the through-hole. Accordingly, the preferred embodiment of the present invention is fabricated of a bronze alloy. A bronze alloy retains sufficient mechanical characteristics to provide sufficient spring bias for carrying out the desired employment of the invention, and maintains appropriate electrical characteristics also.

The preferred embodiment of the present invention involves ensuring that no interstitial bonding material, such as solder, is present between layers of the spirally wound roll pin. Preferably, the interior of the roll pin is coated with a plating mask material to assure that no bonding material will be deposited between layers. Such an avoidance of interstitial bonding is preferred in order that the roll pin can exercise its spring bias imparted by spiral rolling to expand within a through-hole and establish the desired nearly 360 degree contact with the inner wall of the through-hole. Outside surfaces of the roll pin may have plating mask material removed and the exposed outside surfaces may be plated to permit bonding, such as soldering, between the roll pin and the inner wall of the through-hole.

An alternate embodiment of the present invention is constructed for self-healing properties in the event of overheating of the circuit in which the connector pin is included. In such an alternate embodiment, interior interstitial surfaces of the roll pin are intentionally plated and solderable, and solder material is intentionally introduced interstitially between the roll pin layers. In such an alternate construction, interstitially situated solder will reflow to heal connection rifts in the event of an overheating condition. Preferably, the alternate embodiment is installed before being exposed to a heated environment. After situating a roll pin with interstitial solder into an aperture, subsequent heating reflows the solder sufficiently to facilitate exercising the spring bias of the roll pin to establish a nearly 360 degree contact with the interior wall of the through-hole.

An advantage is provided by the present invention in assembling multi-board circuits because the firmly seated joint between the roll pin and a through-hole better assures a perpendicular relation between the pin and an associated board, or boards. Such a plumb orientation is important in through-hole-to-through-hole connections in which each board in a multi-board circuit is connected by a pin inserted into a through-hole.

A different multi-board joint arrangement, a through-hole-to-pad inter-board connection, is also provided with a more reliable plumb arrangement by the present invention,. In such an arrangement one board is connected with a pin-and-though-hole joint, generally of the sort described above. The second board presents a pad for bonded (e.g., solder) joining with the pin. Usually the pin has a pad structure to present a pad-to-pad bonding area. The firm physical fit of the near 360 degree contact between the pin and the inner wall of the through-hole of the first board maintains the pin in a desired orientation plumb with both boards during installation. The resultant finished joint construction is more reliably properly plumb after installation when the present invention is employed for multi-board connections.

It is, therefore, an object of the present invention to provide an apparatus and method for connecting a plurality of circuits borne upon a plurality of substrates that establish physical and electrical connection interconnections between substrates and require low pressing forces for assembly.

It is a further object of the present invention to provide an apparatus and method for connecting a plurality of circuits borne upon a plurality of substrates that has high conductivity and high current-carrying capacity.

It is yet a further object of the present invention to provide an apparatus and method for connecting a plurality of circuits borne upon a plurality of substrates that establishes an air-tight hermetic joint within a mounting aperture.

It is still a further object of the present invention to provide an apparatus and method for connecting a plurality of circuits borne upon a plurality of substrates that has a self-healing characteristic to repair circuit anomalies caused by overheating.

Further objects and features of the present invention will be apparent from the following specification and claims when considered in connection with the accompanying drawings, in which like elements are labeled using like reference numerals in the various figures, illustrating the preferred embodiment of the invention.

DETAILED DESCRIPTION OF THE DRAWINGS

DETAILED DESCRIPTION OF THE INVENTION

Figure 1:
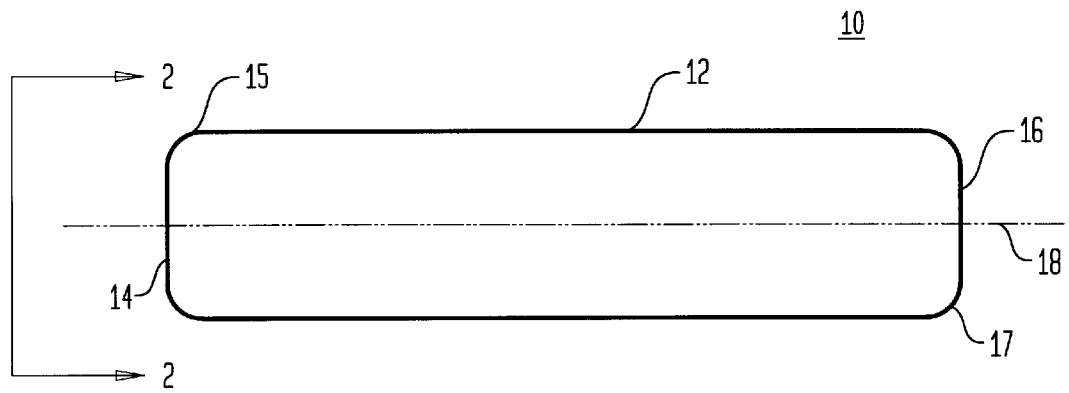
FIG. 1 is a side elevation view of the preferred embodiment of the apparatus of the present invention.

FIG. 1 is a side elevation view of the preferred embodiment of the apparatus of the present invention. In FIG. 1, a pin 10 has an elongate body 12 with a first end 14 and a second end 16. Body 12 is oriented about a longitudinal axis 18. Body 12 presents a chamfered, or beveled edge 15 at first end 14, and presents a similarly beveled edge 17 at second end 16. Beveled edges 15, 17 facilitate insertion of pin 10 into an aperture (not shown in FIG. 1).

Figure 2:
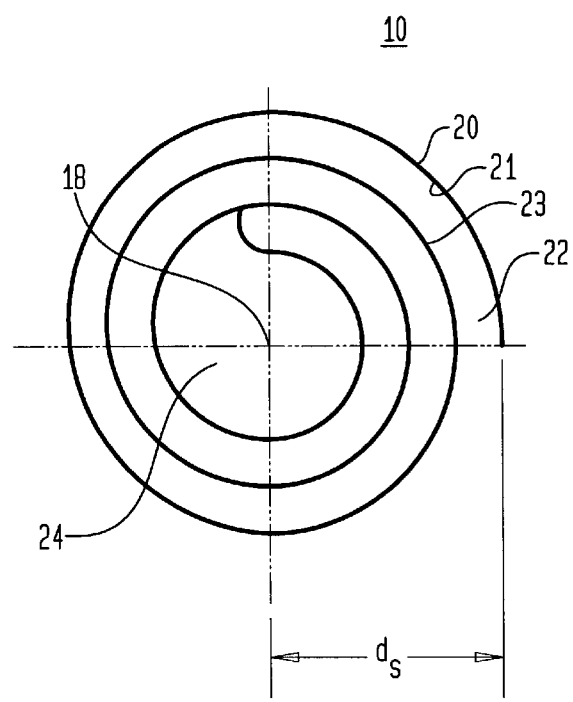
FIG. 2 is an end view of the preferred embodiment of the apparatus of the present invention taken along Section 2—2 in FIG. 1.

FIG. 2 is an end view of the preferred embodiment of the apparatus of the present invention taken along Section 2—2 in FIG. 1. In FIG. 2, pin 10 is formed of a sheet 20 wound spirally about axis 18 to a spring dimension "$d_s$" from axis 18. Pin 10 has an interstitial space 22 bounded by facing lands 21, 23 of successive winding layers of sheet 20 and a central void 24 generally helically oriented about axis 18 in planes perpendicular to axis 18. FIG. 2 is illustrated in an exaggerated scale to clearly illustrate interstitial space 22. In the preferred embodiment of pin 10, interstitial space 22 is very small, and successive spirally wound layers of sheet 20 are in abutting relation at many loci. wound spirally about axis 18 to a spring displacement "$d_s$" from axis 18. Pin 10 has an interstitial space 22 bounded by facing lands of successive winding layers of sheet 20 and a central void 24 generally oriented about axis 18. FIG. 2 is illustrated in an exaggerated scale to clearly illustrate interstitial space 22. In the preferred embodiment of pin 10, interstitial space 22 is very small, and successive spirally wound layers of sheet 20 are in abutting relation at many loci.

Figure 3:
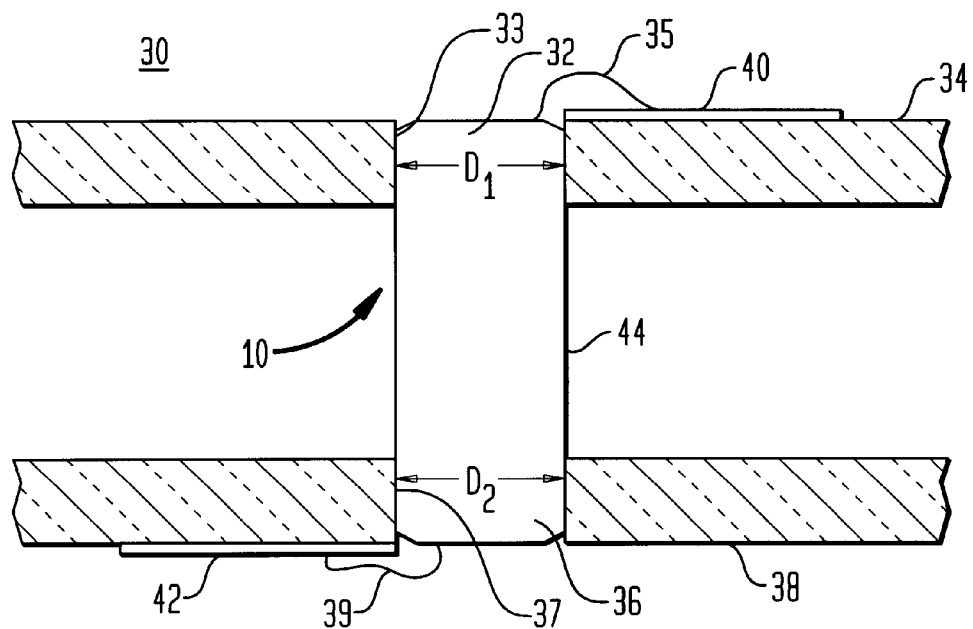
FIG. 3 is a schematic partial section view of the apparatus of the present invention employed in a through-hole-to-through-hole installation with two substrates.

FIG. 3 is a schematic partial section view of the apparatus of the present invention employed in a through-hole-to-through-hole installation with two substrates. In FIG. 3, an assembly 30 includes a pin 10 installed within a through-hole 32 in a substrate 34. Through-hole 32 has a diameter $D_1$ defined by an inner wall 33. Pin 10 is also installed within a through-hole 36 in a substrate 38. Through-hole 36 has a diameter $D_2$ defined by an inner wall 37. Not illustrated in detail in FIG. 3, but well understood by those skilled in the art, inner walls 33, 37 are plated to facilitate soldering thereto. Inner wall 33 is electrically connected with an electrical circuit 40 carried upon substrate 34. Inner wall 37 is electrically connected with an electrical circuit 42 carried upon substrate 38. Inserting pin 10 within through-holes 32, 36 and allowing pin 10 to expand in response to the spring bias imparted to pin 10 during its previously being spirally wound establishes a mechanical and electrical spring-force-held, substantially hermetically sealed bond between pin 10 and inner walls 33, 37. The bond thus established electrically connects pin 10 with electrical circuits 40, 42 and mechanically fixes substrates 34, 38 with respect to pin 10 and, therefore, with respect to each other. In order to further ensure good electrical and physical bonding, outer surface 44 of pin 10 may be plated or otherwise treated to facilitate solder bonding 35, 39 between pin 10 and inner walls 33, 37.

Figure 4:
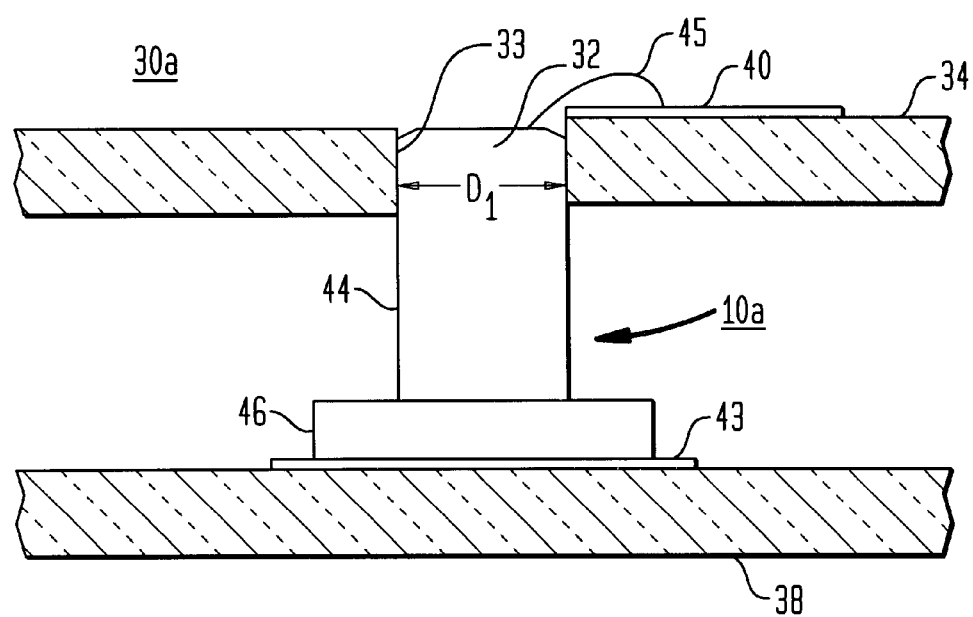
FIG. 4 is a schematic partial section view of the apparatus of the present invention employed in a pad-to-through-hole installation with two substrates.

FIG. 4 is a schematic partial section view of the apparatus of the present invention employed in a pad-to-through-hole installation with two substrates. In FIG. 4, an assembly 30a includes a pin 10a installed within a through-hole 32 in a substrate 34. Through-hole 32 has a diameter $D_1$ defined by an inner wall 33. Pin 10a presents a pad structure 46 to substrate 38 to facilitate connection with a circuit 43 carried upon substrate 38. Circuit 43 presents itself to pad structure 43 as a pad, similar to pads employed by those skilled in the art of circuit design for connecting surface mounted components within a circuit. Pad structure 46 is preferably mechanically and electrically integral with pin 10a. As an example, pad 46 may be integrally formed with pin 10a by a heading operation carried out at one end of pin 10a. Pad structure 46 is plated or otherwise treated to facilitate solder bonding between pin 10a and circuit 43. Pad structure 46 is urged against circuit 43 and preferably subjected to a bonding operation, such as soldering during manufacture of assembly 30a. Soldering may be carried out by reflow soldering, wave soldering, or other methods of soldering. The resultant structure presents pad structure 46 and circuit 43 bonded mechanically and electrically. Outer surface 44 of pin 10a is plated or otherwise treated to facilitate solder bonding 45 between pin 10a and inner wall 33.

Figure 5:
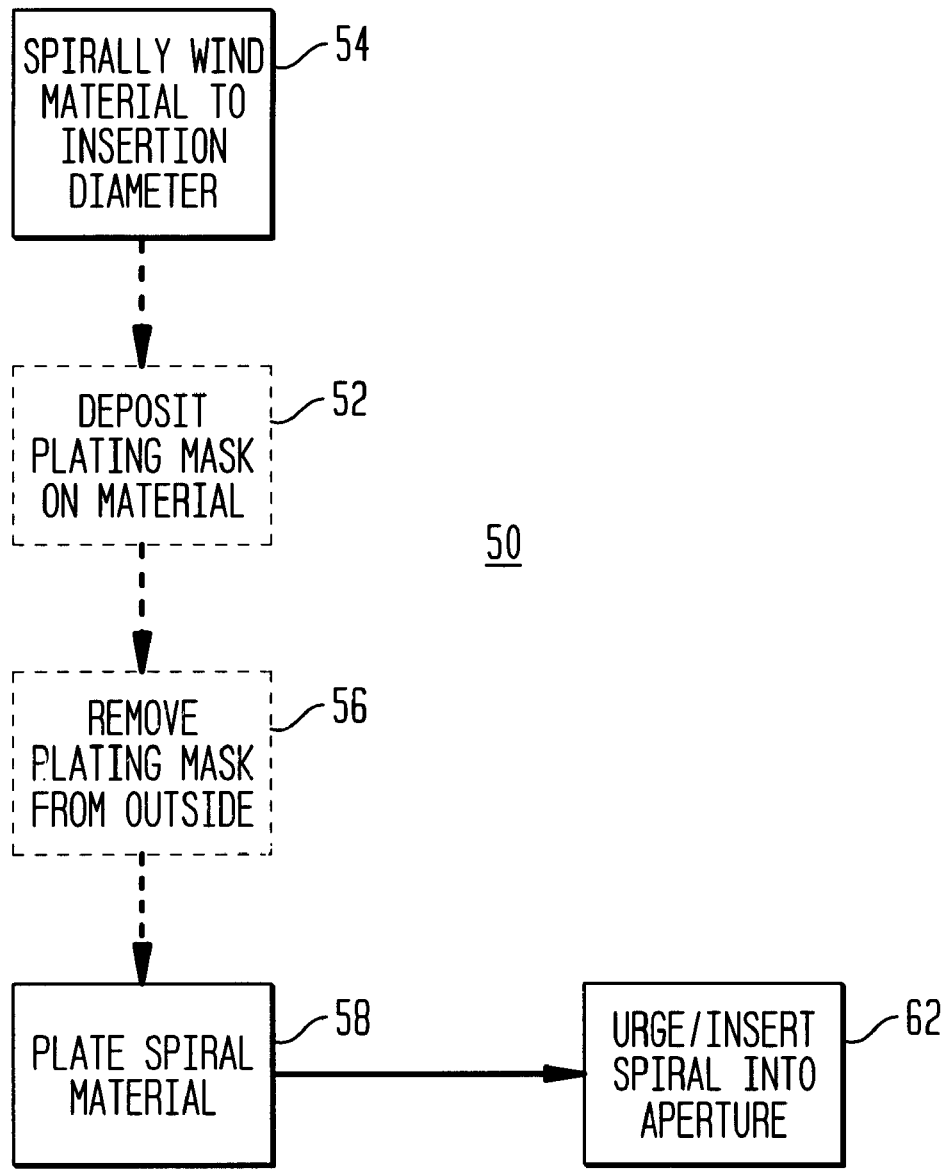
FIG. 5 is a flow chart illustrating the method of the present invention.

FIG. 5 is a flow chart illustrating the method of the present invention. FIG. 5 illustrates the preferred embodiment of a method for connecting a plurality of electrical circuits borne upon a plurality of substrates, among which at least a first substrate has a first aperture having a first diametral displacement and a first inner wall. At least a portion of the first inner wall is electrically conductive and is connected with a first circuit of the plurality of circuits borne upon the first substrate. The method 50 begins with a step of spirally winding a sheet of material to an insertion diametral displacement generally equal to or slightly larger than the first diametral displacement, as indicated by a block 54. After spirally winding the material according to block 54, a plating mask material is deposited upon the spirally wound material, as indicated by a block 52. A preferred procedure for depositing plating mask material upon the spirally wound material is to submerge the spirally wound material in a bath of plating mask material.

Method 50 continues with a step of removing the plating mask from outside surfaces of the spirally wound material, as indicated by a block 56. Following removal of plating material from outside surfaces of the spirally wound material according to block 56, the spirally wound material is plated, as indicated by a block 58. As a practical matter, removing plating mask material only from outside surfaces of the spirally wound material, as represented by block 56 ensures that only outside surfaces of the spirally wound material are plated pursuant to the method step represented by block 58. The outside surfaces of the spirally wound material may be plated to enhance their solderability.

In the assembled arrangement of assembly 30a, inner wall 33 is electrically connected with an electrical circuit 40 carried upon substrate 34, pin 10a is soldered with inner wall 33 of through-hole 32 and pad structure 46 is soldered with electrical circuit 43 carried upon substrate 38. In the assembled arrangement of assembly 30a illustrated in FIG. 4, substrates 34, 38 are mechanically fixed with pin 10a. The assembled arrangement of assembly 30a also electrically connects circuits 40, 43 with pin 10a through inner wall 33 of though-hole 32 and through pad structure 46.

The spirally wound material is urged into the first aperture, as indicated by a block 62. The spring bias imparted to the material during spiral winding urges the spirally wound material toward a diametral displacement greater than the insertion diametral displacement until the spirally wound material bears against the inner wall of the aperture. The spring bias urging the spirally wound material against the inner wall of the aperture holds the spirally wound material in position within the aperture during subsequent processing, such as soldering or some other bonding process.

As mentioned previously, the spirally wound material does not require soldering to perform its required function. Simple insertion of the spirally wound material within an aperture advantageously employs spring bias imparted to the spirally wound material during spiral winding to impart a spring bias toward a greater diameter in the spirally wound material. That spring bias urges the spirally wound material against the interior wall of an aperture to establish an electrical and mechanical bond with the aperture.

If it is not desired that interstitial spaces between consecutive wound layers of spirally wound material remain solder free, then steps indicated by blocks 52, 56 may be omitted, and the method may be practiced by steps represented by blocks 54, 58, 62. Such an elimination of method steps represented by blocks 52, 56 may be intentionally effected in order to produce a self-healing connector structure of the sort described hereinbefore. In such a self-healing structure, interstitial solder deposits reflow during high temperature conditions to fill rifts that otherwise may exist in high temperature conditions.

It is to be understood that, while the detailed drawings and specific examples given describe preferred embodiments of the invention, they are for the purpose of illustration only, that the apparatus and method of the invention are not limited to the precise details and conditions disclosed and that various changes may be made therein without departing from the spirit of the invention which is defined by the following claims:

We claim:

1. An apparatus for connecting a plurality of electrical circuits borne upon a plurality of substrates; at least a first substrate of said plurality of substrates having a first aperture, said first aperture having a first inner wall establishing a first diametral dimension, at least a portion of said first inner wall being electrically connected with a first circuit of said plurality of circuits borne upon said first substrate; the apparatus comprising: an insert member; said insert member being formed from a substantially rectangular sheet of electrically conductive material arranged to a generally cylindrical shape having a second diametral dimension from a longitudinal axis substantially between a first end and a second end; said insert member being in a substantially helical orientation about said longitudinal axis in planes perpendicular with said longitudinal axis; said material having a spring characteristic when said helical orientation establishes said second diametral dimension at a spring dimension less than said first diametral dimension; said spring dimension permitting locating said insert member in said first aperture; said spring characteristic biasing said conductive material to expand to a greater dimension from said longitudinal axis than said spring dimension to an installed dimension substantially equal with said first diametral dimension in an installed orientation within said first aperture; said spring characteristic biasing said conductive material against said first inner wall in said installed orientation to seat the insert member in said first aperture to establish an electrical connection between said insert member and said first circuit.

2. The apparatus for connecting a plurality of electrical circuits borne upon a plurality of substrates as recited in claim 1 wherein at least a second substrate of said plurality of substrates has a second aperture, said second aperture having a second inner wall defining a second diametral dimension, at least a portion of said second inner wall being electrically connected with a second circuit of said plurality of circuits borne upon said second substrate; said spring dimension permitting locating said insert member in said second aperture; said spring characteristic biasing said conductive material to expand to a greater dimension from said longitudinal axis than said spring dimension to said installed dimension substantially equal with said second diametral dimension in said installed orientation within said second aperture; said spring characteristic biasing said conductive material against said second inner wall in said installed orientation to seat said insert member in said second aperture to establish electrical connection between said insert member and said second circuit.

3. The apparatus for connecting a plurality of electrical circuits borne upon a plurality of substrates as recited in claim 1 wherein said substantially helical orientation establishes an interstitial space bounded by facing lands of said conductive material; said facing lands being substantially free of joining material.

4. The apparatus for connecting a plurality of electrical circuits borne upon a plurality of substrates as recited in claim 1 wherein said substantially helical orientation establishes an interstitial space bounded by facing lands of said conductive material; said facing lands being at least intermittently provided with joining material appropriate for bonding the apparatus into a substantially inflexible structure.

5. The apparatus for connecting a plurality of electrical circuits borne upon a plurality of substrates as recited in claim 4 wherein said joining material is solder.

6. The apparatus for connecting a plurality of electrical circuits borne upon a plurality of substrates as recited in claim 2 wherein said substantially helical orientation establishes an interstitial space bounded by facing lands of said conductive material; said facing lands being substantially free of joining material.

7. The apparatus for connecting a plurality of electrical circuits borne upon a plurality of substrates as recited in claim 2 wherein said substantially helical orientation establishes an interstitial space bounded by facing lands of said conductive material; said facing lands being at least intermittently provided with joining material appropriate for bonding the apparatus into a substantially inflexible structure.

8. The apparatus for connecting a plurality of electrical circuits borne upon a plurality of substrates as recited in claim 7 wherein said joining material is solder.

9. A system for mechanically fixing a first substrate with respect to a second substrate and establishing an electrical connection between a first electrical circuit carried on said first substrate and a second electrical circuit carried on said second substrate; said first substrate having a first electrically conductive through-hole with a first diametral dimension; said first conductive through-hole being connected with said first electrical circuit; said second substrate having a second electrically conductive through-hole with a second diametral dimension; said second conductive through-hole being connected with said second electrical circuit; the system comprising: a substantially rectangular sheet of electrically conductive material spirally wound to an insertion member having an insertion diametral dimension; said insertion diametral dimension being smaller than said first diametral dimension and said second diametral dimension to facilitate insertion into said first through-hole and said second through-hole; said insertion member having a spring bias imparted by said winding; said spring bias increasing said insertion diametral dimension of said spirally wound material to substantially equal said first diametral dimension in said first through-hole, and to substantially equal said second diametral displacement in said second through-hole after said insertion.

10. The system for mechanically fixing a first substrate with respect to a second substrate and establishing an electrical connection between a first electrical circuit carried on said first substrate and a second electrical circuit carried on said second substrate as recited in claim 9 wherein said spirally wound material has an interstitial space bounded by facing lands of said conductive material; said facing lands being substantially free of joining material.

11. The system for mechanically fixing a first substrate with respect to a second substrate and establishing an electrical connection between a first electrical circuit carried on said first substrate and a second electrical circuit carried on said second substrate as recited in claim 9 wherein said spirally wound material has an interstitial space bounded by facing lands of said conductive material; said facing lands being at least intermittently provided with joining material appropriate for bonding said spirally wound material into a substantially inflexible structure.

12. The system for mechanically fixing a first substrate with respect to a second substrate and establishing an electrical connection between a first electrical circuit carried on said first substrate and a second electrical circuit carried on said second substrate as recited in claim 9 wherein said joining material is solder.

13. A method for connecting a plurality of electrical circuits borne upon a plurality of substrates; at least a first substrate of said plurality of substrates having a first aperture, said first aperture having a first inner wall establishing a first diametral dimension, at least a portion of said first inner wall being electrically conductive and connected with a first circuit of said plurality of circuits borne upon said first substrate; the method comprising the steps of:

(a) spirally winding a substantially rectangular sheet of electrically conductive material to an insertion member having an insertion diametral dimension; said insertion diametral dimension being generally equal to or slightly greater than said first diametral dimension; and (b) urging said insertion member into said first aperture.

14. The method for connecting a plurality of electrical circuits borne upon a plurality of substrates as recited in claim 13 wherein the method comprises, following step (a), the further steps of:

(1) depositing a plating mask material upon said electrically conductive material;

(2) removing said plating mask from outside surfaces of said insertion member; and (3) plating said outside surfaces to enhance solderability of said outside surfaces.

* * * * *